United States Patent [19]

Tatum et al.

[11] Patent Number: 4,458,413
[45] Date of Patent: Jul. 10, 1984

[54] PROCESS FOR FORMING MULTI-GAUGE STRIP

[75] Inventors: Robert N. Tatum, Chesterfield, Mo.; Robert W. Hofer, Watertown, Conn.; S. Paul Zarlingo, Granite City, Ill.

[73] Assignee: Olin Corporation, New Haven, Conn.

[21] Appl. No.: 420,071

[22] Filed: Sep. 20, 1982

Related U.S. Application Data

[62] Division of Ser. No. 228,633, Jan. 26, 1981, Pat. No. 4,404,264.

[51] Int. Cl.³ .................... H01R 43/00; B23C 1/00
[52] U.S. Cl. .................................... 29/827; 29/521; 228/115; 228/159; 228/160; 228/161
[58] Field of Search .................. 29/827, 521; 228/115, 228/159, 160, 161; 83/870, 871, 872, 875

[56] References Cited

U.S. PATENT DOCUMENTS

| | | |
|---|---|---|
| 2,653,117 | 9/1953 | Keene . |
| 3,202,588 | 8/1965 | Fromson . |
| 3,381,364 | 5/1968 | Winter ................... 228/172 |
| 3,391,426 | 7/1968 | Hugill . |
| 3,391,456 | 7/1968 | Gannoe ................... 29/827 |
| 3,397,045 | 8/1968 | Winter ................... 428/612 |
| 3,465,419 | 9/1969 | Keenan et al. ........... 228/160 |
| 3,514,840 | 6/1970 | Pitler ..................... 228/159 X |
| 3,539,675 | 11/1970 | Hugill . |
| 3,555,664 | 1/1971 | Bingham et al. ......... 228/115 |
| 3,559,285 | 2/1971 | Kauffman . |
| 3,574,815 | 4/1971 | Segerson . |
| 3,606,673 | 9/1971 | Overman . |
| 3,611,061 | 10/1971 | Segerson . |
| 3,627,901 | 12/1971 | Happ ...................... 174/52 PE |
| 3,628,483 | 12/1971 | Pauza . |
| 3,630,429 | 12/1971 | Matsuda et al. ......... 228/3.1 |
| 3,684,464 | 8/1972 | Happ et al. ............. 428/614 |
| 3,706,246 | 12/1972 | Keith . |
| 3,793,714 | 2/1974 | Bylander . |
| 3,826,627 | 7/1974 | Pryor et al. . |
| 3,938,723 | 2/1976 | Slaughter ............... 228/159 X |
| 3,955,934 | 5/1976 | Tizzi . |
| 3,992,977 | 11/1976 | Winter et al. . |
| 4,354,301 | 10/1982 | Takeuchi et al. ........ 228/160 X |

FOREIGN PATENT DOCUMENTS 913812  10/1972  Canada ........................ 29/827

Primary Examiner—Howard N. Goldberg
Assistant Examiner—Carl J. Arbes
Attorney, Agent, or Firm—Howard M. Cohn; Paul Weinstein; Barry L. Kelmachter

[57] ABSTRACT

An improved method and apparatus for the production of multi-gauge strip is disclosed wherein the multi-gauge strip comprises a first strip of metal having a first thickness and extending longitudinally for a given length. A second strip of metal has a second thickness, is narrower in width than the first strip, and coextends longitudinally with the first strip of metal. The first and second strips of metal are intimately bonded in direct metal-to-metal contact without the use of a welding or brazing material. The multi-gauge strip has a first portion extending the given length with a third thickness substantially equal to the sum of the first and second thicknesses and a second portion of substantially constant width extending the given length having a fourth thickness substantially equal to the first thickness.

10 Claims, 6 Drawing Figures

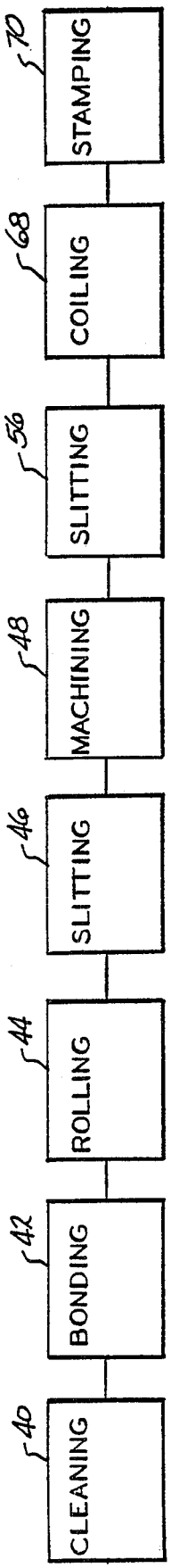
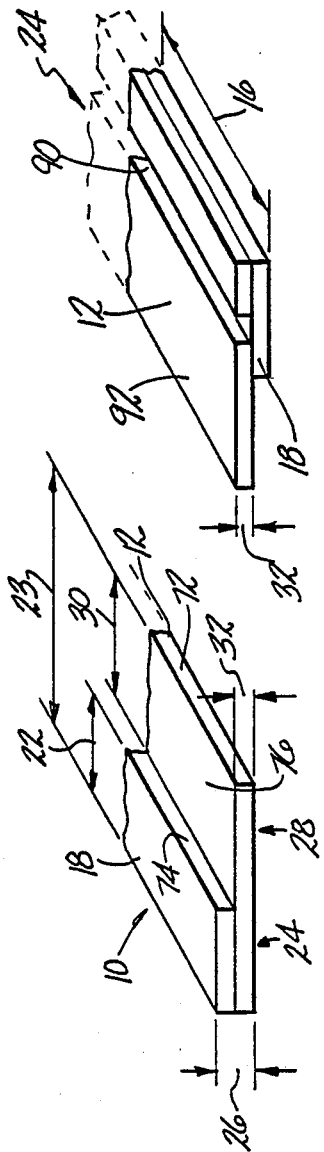
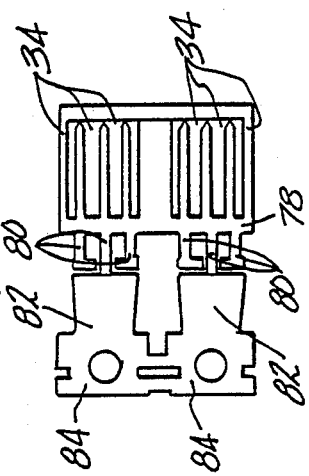
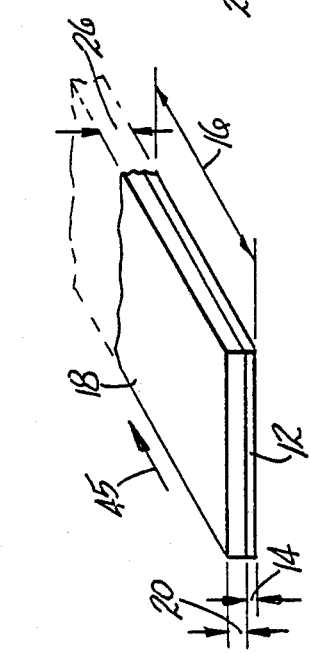
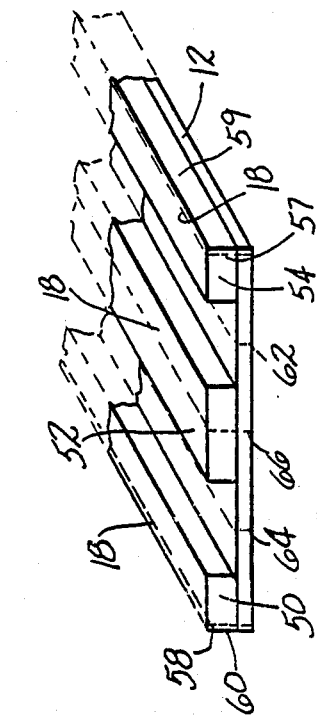

PROCESS FOR FORMING MULTI-GAUGE STRIP

This application is a division of application Ser. No. 228,633, filed Jan. 26, 1981 now U.S. Pat. No. 4,404,264 issued June 10, 1983.

While the invention is subject to a wide range of applications, it is especially suited for use in the formation of multi-gauge strip suitable to produce articles such as electrical leadframes and will be particularly described in that connection.

A particular group of leadframes has the dual requirement of high strength and high thermal conductivity. Typically, the high thermal conductivity is required to dissipate heat from an electronic device mounted or connected to the leadframe. Failure to dissipate sufficient heat may cause malfunction of the electronic device. In addition, high strength is required so that the leadframe can be handled both manually and automatically without distortion of the leadframe.

In the past, different metals used to construct leadframes provided sufficient conductivity but compromised the desired strength. In other cases, sufficient strength was obtained, but the metal lacked the desired conductivity. The problem is further complicated by the requirement that the leadframes have "thick and thin portions". A thick gauge provides improved heat dissipation while a thin gauge, being more easily formed and soldered, provides connecting legs. The present invention provides a multi-gauge strip which fulfills all the above-mentioned requirements by bonding two different strips of metal and machining them to different gauges.

A technique is known to pressure bond materials by rolling them together in accordance with the principles set forth in U.S. Pat. Nos. 3,381,364 and 3,397,045 both to Winter. This technique intimately bonds at least two strips of metals together in metal-to-metal contact without the use of an intervening material such as a welding or brazing material.

Once the two sheets of metal have been joined together, it is necessary to continuously mill the resulting strip to produce the desired variations in gauge. In U.S. Pat. No. 3,992,977 to Winter et al., a method of continuous shaving to produce a multiple gauge metal strip is disclosed.

U.S. Pat. No. 3,630,429 to Matsuda et al. discloses an apparatus to form composite metal wire consisting of steel wire or the like cladded with a metal covering of aluminum or other metals. The apparatus provides pressure bonding at a high temperature followed by shaving off any excess material created during the bonding process.

U.S. Pat. No. 3,465,419 to Keenan et al. discloses, for example, a method of making decorative metal stock wherein a plurality of metal layers are bonded together by known bonding techniques and recessing certain selective area portions of the laminated cladding by machinery, drilling, or grinding. This reference uses a bonding technique different from the present invention and does not provide for the longitudinal removal of metal from a strip as required by the present invention.

U.S. Pat. No. 3,202,588 to Fromson discloses a method of making decorative metal sheet wherein two layers of material are metallurgically bonded together, a protective coating applied to selected areas of the exposed surface of one of the layers and removal in the uncoated areas by grinding, milling, or etching. The present invention does not require a protective coating because the shaving apparatus is able to selectively remove the desired material.

U.S. Pat. No. 3,826,627 to Pryor et al. discloses a decorative composite article wherein two materials may be bonded by any suitable technique such as pressure rolling as disclosed in U.S. Pat. No. 3,381,364. Then, portions of one of the layers may be removed by a suitable method such as machining or chemical etching. This reference does not disclose the concept of the present invention where the metal removal is accomplished by a continuous shaving in the longitudinal direction of the bonded strip material.

It is a problem underlying the present invention to provide an apparatus and method to form a multi-gauge strip useful for items having the requirements of high strength, high thermal and electrical conductivity, and variation in gauge.

It is an advantage of the present invention to provide an apparatus and method of forming multi-gauge stirip which substantially obviates one or more of the limitations and disadvantages of the described prior arrangements.

It is a further advantage of the present invention to provide an apparatus and process for forming multi-gauge strip which can operate in a continuous manner.

It is a still further advantage of the present invention to provide an apparatus and process for forming multi-gauge strip which can be operated very quickly, efficiently and, therefore, economically.

Accordingly, there has been provided an improved method and apparatus for the production of multi-gauge strip wherein the multi-gauge strip comprises a first strip of metal having a first thickness and extending longitudinally for a given length. The multi-gauge strip also has a second strip of metal having a second thickness, being narrower in width than the first strip, and coextending longitudinally with the first strip of metal. The first and second strips of metal are intimately bonded in direct metal-to-metal contact without the use of a welding or brazing material. The multi-gauge strip has a first portion extending the given length with a third thickness substantially equal to the sum of the first and second thicknesses and a second portion of substantially constant width extending the given length having a fourth thickness substantially equal to the first thickness.

Also, the process of forming a multi-gauge strip comprises the following steps: a first strip of metal extending longitudinally for a given length is provided. A second strip of metal coextending longitudinally with the first strip is provided. The first and second strips of metal are pressure bonded together in direct metal-to-metal contact without the use of a welding or brazing material. The resulting strip has a first layer formed of the first strip of metal having a first thickness and a second layer formed of the second strip of material having a second thickness. A longitudinal section of the second strip of metal is machined off of a given length to a depth so as to expose the first strip of metal. A first portion of the multi-gauge strip, extending the given length, has a third thickness substantially equal to the sum of the first and second thicknesses. A second portion of the multi-gauge strip, extending the given length, has a fourth thickness substantially equal to the first thickness.

The invention and further developments of the invention are now elucidated by means of preferred embodiments shown in the drawings:

FIG. 1 is a flow chart of the processes of the subject invention;

FIG. 2 is a cross section of two bonded strips of material;

FIG. 3 is a perspective view of a shaved bonded strip before slitting;

FIG. 4 is a perspective view of a multi-gauge strip;

FIG. 5 is a top view of a stamped leadframe; and

FIG. 6 is a view of a multi-gauge strip having a slot in accordance with the present invention.

In accordance with the present invention, a multi-gauge strip 10 is provided. The multi-gauge strip includes a first strip of metal 12 having a first thickness 14 and extending longitudinally for a given length 16. A second strip of metal 18 having a second thickness 20, is narrower in width 22 than the substantially constant width 23 of the first strip, and coextends longitudinally with the first strip of metal 12. The first and second strips of metals 12 and 18 are intimately bonded in direct metal-to-metal contact without the use of a welding or brazing material whereby the multi-gauge strip 10 has a first portion 24 extending the given length 16 having a third thickness 26 substantially equal to the sum of the first and second thicknesses 14 and 20, respectively. The multi-gauge strip also has a second portion 28 of substantially constant width 30 extending the given length 16 and having a fourth thickness 32 substantially equal to the first thickness 14.

The present invention is concerned with producing a multi-gauge strip which is ideally suited to form a particular family of leadframes having the dual requirement of high strength and high thermal conductivity. Typically, when a given metal has sufficient conductivity, it lacks the desired strength. Similarly, in a given metal having sufficient strength, the metal lacks the desired conductivity. Further, the leadframes have thick and thin gauges. The thick gauge is useful for conduction, while the thin gauge, being formable and solderable, is useful for connecting legs. The present invention provides a process and apparatus to quickly and efficiently form multi-gauge strip having both high conductivity and strength.

The first strip 12 is formed of a material having high strength and sufficient thermal and electrical conductivity. This material is preferably a copper alloy such as CDA 510, CDA 762, or CDA 725. Since this material is used to form the connecting legs 34 of a leadframe requiring formability and solderability, the gauge is relatively thin. Due to the standards of the electronic industry, the legs usually have a thickness of either 0.015" or 0.018". Accordingly, this is the preferred thickness of the material of the first strip 12. Of course, it is within the scope of the present invention to form the strip 12 of other alloys or metals and of other thicknesses.

The second strip 18 is formed of a high thermal and electrical conductive material such as CDA 192, CDA 194, or CDA 110. Since the strip 18 is used as a heat sink, it is preferably thicker than the strip 12. Due to the standards of the industry with respect to the dimensions of leadframes, such as leadframe 36, the thickness 20 of the strip 18 is preferably 0.050". It is within the scope of the present invention to form the strip 18 of other materials such as metals or alloys which have the characteristic of high electrical and thermal conductivity.

In order to more fully understand the process by which multi-gauge strip 10 is manufactured and formed into the leadframe 36 as shown in FIG. 4, a detailed exemplary description follows. Referring to the flow diagram of FIG. 1, block 40 represents a cleaning station where the metals may be cleaned preparatory to joining. The cleaning process may be in accordance with that described in U.S. Pat. No. 3,397,045 which includes a wet chemical cleaning treatment to degrease the metal surface. In addition, the surfaces to be joined may be mechanically cleaned and roughened by mechanical wire brushing in accordance with the latter reference if so desired. Although these processes may be desirable, they are not necessarily required and may be omitted if so desired.

The two strips of metal then move to a bonding station represented by block 42. At this station, the strips are intimately bonded in direct metal-to-metal contact without the use of a welding or brazing material. This bonding may be accomplished in accordance with the posit bonding principles as set forth in U.S. Pat. No. 3,397,045 or 3,381,364. As described in those patents, the two strips of material are fed into a rolling mill at different speeds to form an integrated composite strip of material where the direct metal-to-metal contact is a substantially diffusionless interatomic bond.

After the strip is bonded, the thickness 26 of the composite strip may be greater than desired. In this instance, the strip of material is preferably run through a rolling mill station represented by block 44 where it is reduced to the proper thickness of approximately 0.050". Of course, it may not be necessary to provide this station as the rolling mill used for the bonding process may have already formed the strip to the desired thickness. In either case, the resulting strip will have a first layer formed of the first strip of metal and a second layer formed of the second strip of metal. The resulting strip will have a given length 16, preferably very long, and a general configuration as shown in FIG. 2. Specifically, the first strip 12 will have a first thickness 14 which is preferably either 0.015" or 0.018" as described above. The second strip 18 will have a second thickness 20 which is preferably 0.035". Also, the length of the bonded strip will extend in a longitudinal direction indicated by arrow 45 for some given length 16. At this stage of the process, the strip may be approximately 16" wide.

The strip may then be fed through a slitting station indicated by block 46 where the strip is slit into four longitudinal bonded strips having parallel outer edges. The slitting may be accomplished by any conventional device such as the slitters shown and described in U.S. Pat. No. 3,706,246 to Keith. Although this slitting operation is frequently required, it is within the scope of the present invention to forego this step in the event that the strip, which has been bonded and if necessary re-rolled, is already the proper width.

The strip now enters a machining station indicated by block 48 where the machining is performed by draw shaving in accordance with the method and apparatus as taught in U.S. Pat. No. 3,992,977. The shaving tool device described in the latter reference reduces the volume of the second strip 18 in a manner as shown in the example of FIG. 3. This shaving technique has certain important advantages over conventional milling procedures in removing material in a longitudinal direction from the bonded strip. The advantages include higher speeds of operation, easier scrap retrieval, and fewer passes in less time. The strip passes through the shaving apparatus one or more times as required until longitudinal sections of the second strip of metal 18 are removed for the given length 16 of the strip to a depth whereby the first strip of metal 12 is exposed. It is frequently necessary to run the strip through the shaving apparatus a number of times in order to remove the desired amount of material without exceeding the yield strength of the strip whereby it may rupture. This can be understood by referring to FIG. 3 where two longitudinal sections have been removed leaving three remaining longitudinal sections 50, 52 and 54 of the second strip of metal 18. It is within the scope of the present invention to provide any desired configuration of the strip, after it has left the machining or shaving station 48, as a matter of choice. For instance, there may be more or less grooves cut into the strip at either less or greater thicknesses.

The shaved strip may then be fed into a station 56 where it is slit in the manner described for station 46. In the example described herein, the strip as shown in FIG. 3 could be slit into five separate strips of material; two of these slits 57 and 58 would preferably be very close to the outer edges 59 and 60, respectively, of the strip in order to remove any excess material from the other resulting multi-gauge strips. Two additional slits, at locations designated as 62 and 64, would be centered between longitudinal sections 50, 52 and 54. The final slit would be through the center of the section 52 through the dotted line 66. The result of this slitting operation would be four, substantially identical, multi-gauge strips with a configuration as shown in FIG. 4. It should be noted, that although the slitting operation at station 56 may be independent from the shaving operation at station 48, the slitting apparatus may be incorporated directly into the line with the shaving apparatus whereby the strip is slit immediately after it has been shaved down to the proper dimensions.

Finally, the strip may be coiled at station 68 into rolls of finished multi-gauge strip. Of course, it is not necessary that the strip be coiled, but it may be stored in any other desired manner.

Referring to FIG. 4, there is illustrated a section of the finished multi-gauge strip in accordance with the example set forth herein. As mentioned hereinabove, the multi-gauge strip includes a first and second portion 24 and 28, respectively. The second portion 28 extends from the first portion to the longitudinal outer edge 72 of the first strip 12 of material. The longitudinal outer edge 74 of the first portion 24, formed by the second strip 18, is illustrated and preferably extends at an approximate 90° angle to the top surface 76 of the first strip 12 in the second portion 28. However, it is within the scope of the invention to provide any preferred angle.

Once the multi-gauge strip is formed, it may be stamped out at a station 70 to form a leadframe such as the type illustrated in FIG. 5. The stamping equipment may be of any conventional design. The leadframe is preferably used for mounting electric devices such as semi-conductors wherein the first strip of metal 12 of the second portion 28 is formed into legs 34. These legs are joined to a dam bar 78 which is connected to the second portion 24 by a plurality of connection leads 80. It can be appreciated that the second portion represented by 28 in FIG. 4 includes the connecting legs 34, the dam bar 78, and the connection leads 80. Accordingly, all of these have the same general thickness equal to the thickness 32 of the first strip 12. The second strip of metal 18 which partially forms the first portion 24 is adapted to be a mounting surface 82 for an electronic device (not shown). Since the second strip is an excellent conductor, it facilitates heat dissipation from the electronic device (not shown). The leadframe also includes cooling fins 84. The illustrated leadframe is only exemplary and alternative configurations may be just as easily produced.

Another embodiment of the present invention, as shown in FIG. 6, includes a longitudinal slot 90 in the first strip of metal 12 within the first portion 24. The number designations are the same as the first embodiment where the same element is represented. The longitudinal slot 90 extends the given length 16 and has a minimum depth equal to the first thickness 32. The exposed inner surface of the second strip of material 18 has a length substantially equal to the slot 90 and is exposed through the slot. Of course, it is within the scope of the present invention to selectively remove metal at other propitious spots whereby electronic devices may be connected to both the surface 92 of the material 12 and to the second strip 18.

The U.S. patents set forth in this application are intended to be incorporated by reference herein.

It is apparent that there has been provided in accordance with this invention a process and apparatus which fully satisfies the objects, means, and advantages set forth herein before. While the invention has been described in combination with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

We claim:

1. A process of forming a multi-gauge strip comprising the steps of:
   providing a first strip of metal extending longitudinally for a given length,
   providing a second strip of metal coextending longitudinally with said first strip,
   pressure bonding said first and second strips of metal together in direct metal-to-metal contact without the use of a welding or brazing material whereby the bonded strip has a first layer formed of said first strip of metal having a first thickness and a second layer formed of said second strip of metal having a second thickness, and
   machining off a longitudinal section of said second strip of metal for said given length to a depth to expose said first strip of metal of said given length prior to any other metal forming of said bonded strip, whereby a first portion of said multi-gauge strip, extending the given length, has a third thickness substantially equal to the first and second thicknesses and a second portion of said multi-gauge strip, extending the given length, has a fourth thickness substantially equal to the first thickness.

2. The process of claim 1 including the step of selecting said first strip of metal from a material of a higher strength than the second metal strip so that said multi-gauge strip is adaptable to function as electrical connectors.

3. The process of claim 2 including the step of selecting said second strip of metal from a material having a conductivity higher than the conductivity of said first strip of metal so that said multi-gauge strip is adaptable for dissipating heat from electrical devices adjoined to said multi-gauge strip.

4. The process of claim 1 wherein said step of machining off includes the step of draw shaving said bonded strip through a shaving apparatus to reduce the volume of said second strip.

5. The process of claim 4 wherein said step of pressure bonding includes the step of feeding the first and second strips of metal into a rolling mill at different speeds to form said bonded strip.

6. The process of claim 5 including the step of longitudinally slitting the bonded strip to form at least two strips with substantially parallel outer edges.

7. The process of claim 5 including the step of cleaning the surfaces of said first and second strips of metal, prior to bonding, to ensure good contact between the contacting surfaces of the strips of metal.

8. The process of claim 7 including the step of stamping out said multi-gauge strip to form a leadframe adapted for mounting electronic devices.

9. A process of forming a multi-gauge strip comprising the steps of:
providing a first strip of metal extending longitudinally for a given length,
providing a second strip of metal coextending longitudinally with said first strip,
pressure bonding said first and second strips of metal together in direct metal-to-metal contact without the use of a welding or brazing material whereby the bonded strip has a first layer formed of said first strip of metal having a first thickness and a second layer of said second strip of metal having a second thickness,
machining off a longitudinal section of said second strip of metal for said given length to a depth to expose said first strip of metal, whereby a first portion of said multi-gauge strip, extending the given length, has a third thickness substantially equal to the first and second thicknesses and a second portion of said multi-gauge strip, extending the given length, has a fourth thickness substantially equal to the first thickness, and
machining a longitudinal slot in said first strip of metal within the first portion, extending said given length and having a minimum depth equal to said first thickness whereby the inner surface of said second strip of material, having a length substantially equal to the length of said slot, is exposed through the slot.

10. The process of claim 9 wherein said step of machining a longitudinal slot includes draw shaving said bonded strip through a shaving apparatus to reduce the volume of said first strip of material.

* * * * *